US011996144B2

(12) United States Patent
Trantham et al.

(10) Patent No.: US 11,996,144 B2
(45) Date of Patent: May 28, 2024

(54) NON-VOLATILE MEMORY CELL WITH MULTIPLE FERROELECTRIC MEMORY ELEMENTS (FMEs)

(71) Applicant: Seagate Technology LLC, Fremont, CA (US)

(72) Inventors: Jon D. Trantham, Chanhassen, MN (US); Praveen Viraraghavan, Chicago, IL (US); John W. Dykes, Eden Prairie, MN (US); Ian J. Gilbert, Chanhassen, MN (US); Sangita Shreedharan Kalarickal, Eden Prairie, MN (US); Matthew J. Totin, Excelsior, MN (US); Mohamad El-Batal, Superior, CO (US); Darshana H. Mehta, Shakopee, MN (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 0 days.

(21) Appl. No.: 17/840,779

(22) Filed: Jun. 15, 2022

(65) Prior Publication Data
US 2022/0399054 A1 Dec. 15, 2022

Related U.S. Application Data

(60) Provisional application No. 63/210,816, filed on Jun. 15, 2021.

(51) Int. Cl.
*G11C 11/56* (2006.01)
*G11C 11/22* (2006.01)

(52) U.S. Cl.
CPC ........ *G11C 11/5657* (2013.01); *G11C 11/221* (2013.01); *G11C 11/223* (2013.01); *G11C 11/2273* (2013.01); *G11C 11/2275* (2013.01)

(58) Field of Classification Search
CPC . G11C 11/5657; G11C 11/221; G11C 11/223; G11C 11/2273; G11C 11/44072
See application file for complete search history.

(56) References Cited

U.S. PATENT DOCUMENTS

| 5,495,438 | A | 2/1996 | Omura |
| 7,372,718 | B2 | 5/2008 | Nagao et al. |
| 8,315,081 | B2 | 11/2012 | Rao et al. |
| 10,038,092 | B1 | 7/2018 | Chen et al. |

(Continued)

*Primary Examiner* — Han Yang
(74) *Attorney, Agent, or Firm* — HOLZER PATEL DRENNAN

(57) ABSTRACT

A non-volatile memory (NVM) is formed of memory cells each having multiple ferroelectric memory elements (FMEs). Each FME stores data in relation to an electrical polarity of a recording layer formed of ferroelectric or anti-ferroelectric material. Each multi-FME memory cell is coupled to a set of external control lines activated by a control circuit in a selected order to perform program and/or read operations upon the FMEs. The FMEs may share a nominally identical construction or may have different constructions. Data are programmed and written responsive to the respective program/read responses of the FMEs. Constructions can include ferroelectric tunneling junctions (FTJs), ferroelectric random access memory (FeRAM), and ferroelectric field effect transistors (FeFETs). The NVM may form a portion of a data storage device, such as a solid-state drive (SSD).

20 Claims, 5 Drawing Sheets

(56) References Cited

U.S. PATENT DOCUMENTS

| | | | |
|---|---|---|---|
| 10,797,237 B2 | 10/2020 | Liu et al. | |
| 2004/0125644 A1* | 7/2004 | Komatsuzaki | G11C 11/5657 |
| | | | 365/154 |
| 2005/0057957 A1* | 3/2005 | Masui | G11C 11/22 |
| | | | 365/145 |
| 2013/0229849 A1* | 9/2013 | Kawashima | G11C 11/221 |
| | | | 365/145 |
| 2014/0075233 A1* | 3/2014 | Bartling | G06F 11/1469 |
| | | | 713/324 |

\* cited by examiner

MULTI-FME MEMORY CELL

FERROELECTRIC TUNNEL JUNCTION (FTJ)

FeRAM (1T-1C) FERROELECTRIC CAPACITOR MEMORY CELL

FeFET MEMORY CELL

FeRAM (6T-4C) FERROELECTRIC CAPACITOR MEMORY CELL

NON-VOLATILE MEMORY CELL WITH MULTIPLE FERROELECTRIC MEMORY ELEMENTS (FMEs)

RELATED APPLICATION

The present application makes a claim of domestic priority to U.S. Provisional Application No. 63/210,816 filed Jun. 15, 2021, the contents of which are hereby incorporated by reference.

SUMMARY

Various embodiments of the present disclosure are generally directed to a memory storage system that incorporates non-volatile memory (NVM) having memory cells each with multiple ferroelectric memory elements (FMEs).

Without limitation, in some embodiments each FME stores data in relation to an electrical polarity of a recording layer formed of ferroelectric or anti-ferroelectric material. Each multi-FME memory cell is coupled to a set of external control lines activated by a control circuit in a selected order to perform program and/or read operations upon the FMEs. The FMEs may share a nominally identical construction or may have different constructions. Data are programmed and written responsive to the respective program/read responses of the FMEs. Constructions can include ferroelectric tunneling junctions (FTJs), ferroelectric random access memory (FeRAM), and ferroelectric field effect transistors (FeFETs). The NVM may form a portion of a data storage device, such as a solid-state drive (SSD).

These and other features and advantages of various embodiments can be understood upon a review of the following detailed description in conjunction with the accompanying drawings.

DETAILED DISCUSSION

Figure 1:
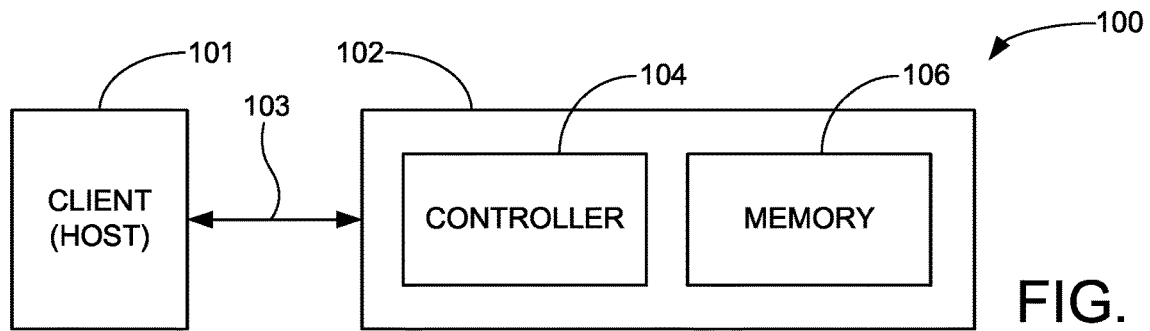
FIG. 1 is a functional block diagram of a data processing system constructed and operated in accordance with various embodiments.

Various embodiments of the present disclosure are generally directed to systems and methods for storing data in a ferroelectric non-volatile memory (NVM).

Ferroelectric memory elements (FMEs) are semiconductor-based memory cells that provide non-volatile data storage with fast response and low power consumption characteristics. A typical FME includes a stack of layers that includes at least one ferroelectric layer which stores data in relation to a programmed and retained electrical field orientation of the layer. The ferroelectric orientation provides different current response characteristics, such as differences in voltage drop across the layer or electrical resistance of the layer. These differences allow the layer to store one or more data storage bits in a non-volatile fashion.

FMEs can be configured in a number of ways to include additional layers including but not limited to an electrode layer, an interposed layer (such as a tunneling layer or a dielectric layer), a metallic layer, a channel region, etc. One or more data bits can be stored by each FME based on the programmed electric polarity, or polarities, of the ferroelectric layer(s) of the FME.

A variety of FME types have been proposed. These include ferroelectric tunneling junctions (FTJs), ferroelectric field effect transistors (FeFETs), and ferroelectric random access memory (FeRAM). Other forms of FMEs have been proposed as well.

Generally, FTJs are somewhat analogous to magnetic tunneling junctions (MTJs) and are usually arranged as two-junction cells with a ferroelectric layer and a tunneling barrier layer sandwiched between opposing electrodes. FTJs are particularly suitable for cross-point arrays and other architectures with two connection points to each memory element.

FeFETs are somewhat analogous to flash memory cells and generally include a gate structure arranged between respective source and drain doped regions. The gate structure includes a ferroelectric layer which is programmed to have a selected electrical polarity that changes the source-drain connectivity of the cell. FeFETs usually have three-junctions (drain, source, gate) and can be readily arranged into two-dimensional (2D) or three-dimensional (3D) structures.

FeRAM cells are somewhat analogous to DRAM cells and are usually arranged with at least one transistor and at least one capacitor. The capacitor includes a ferroelectric layer. A tunneling barrier layer may also be provided in the capacitor. A number of FeRAM arrangements have been proposed, including 1T1FC (one-transistor, one-ferroelectric capacitor) cells, 2T2C cells, 1T4C cells, 6T4C cells, etc. The transistor in each FeRAM cell may be a traditional transistor (e.g., a conventional field effect transistor, FET), although in some cases ferroelectric layer(s) can be applied to the gate structure of the transistor as well as to the capacitor ("dual layer FeRAM"). The impressed electrical polarity of the ferroelectric layer(s) in the capacitor(s) and, as required, the transistor(s), establishes the programmed state of the cell.

A variety of materials, metals and alloys can be used to make up the respective ferroelectric, tunneling and electrode layers. Suitable materials for the ferroelectric layer can include, without limitation, HfO2, ZrO2, Hfl-xZxO2, etc. These materials may be doped with other elements such as but not limited to Si, Ge, Al, Ti, Sc, Y, La, Ce, Gd, Nb, Sr, Ba, N, etc. The tunneling layer(s) may be a suitable non-ferroelectric dielectric including, but not limited to $Al_2O_3$, MgO, SrTiO3, etc. Electrodes are electrically conductive material and may include, without limitation, TiN, TaN, Pt, Ag, CrRu, CrMo, CrW, CrTi, and RuAl. In some cases, anti-ferroelectric materials such as ZrO2 may be used in the place of the ferroelectric layer if an internal bias field, e.g., from two dissimilar electrodes, is introduced in order to shift its hysteresis loop to enable the storage of binary information. These and other examples are merely illustrative and are not limiting.

Various embodiments of the present disclosure are directed to a method and apparatus for storing data to and retrieving data from a memory having ferroelectric memory elements (FMEs). Memory cells are arranged to have multiple FMEs in each cell. The FMEs in each cell can have a nominally identical construction, or can have different constructions. In at least some embodiments, the FMEs will have different read and/or write responses to control signals applied to the cells.

Without limitation, the FMEs can be FTJs, FeFETs, and/or FeRAM. The FeRAM elements can be 1T1FCs, 2T2FCs, 1T4FCs, 6T4FCs, or other forms of ferroelectric-based structures. The FMEs can be arranged in series or in parallel. One, some, or all of the FMEs can use an antiferroelectric memory element (AFME) construction. While two (2) FMEs are contemplated per cell in some embodiments, substantially any plural number of FMEs can be used. The same type of FME can be used in the same cell (e.g., both can be FTJs, etc.) but one can be inverted with respect to the other, or one can be a different size than the other, etc. to provide different storage and response characteristics.

The FMEs in each cell can store the same data or can be programmed to different data states. The FMEs may be arranged logically to express the same or different logic values based on a given polarity. The multi-element cell can store a single bit or multiple bits. In some cases, switching devices such as conventional FETs can be incorporated into the cells to control the individual switching and access to the respective elements. For example, a cell might be configured to charge/program an FC (ferroelectric capacitor) using a first transistor and to read/discharge the FC using a different, second transistor.

It is contemplated that these various arrangements can provide a number of benefits including enhanced read and write speeds, data reliability, data endurance, switching efficiencies, etc. Control circuitry can be used to enhance power, endurance and latency characteristics of the memory.

These and other features and advantages of various embodiments can be understood beginning with a review of FIG. 1, which shows a functional representation of a data processing system 100. The system 100 includes a client (host) device 101 that communicates with a data storage device 102 via an interface 103. The client device 101 may take the form of a personal computer, a smart phone, a workstation, a tablet, a laptop, a gaming system, a microcontroller, a server, an edge device, an Internet of Things (IoT) device, a mass storage array, etc.

The data storage device 102 is configured to store and retrieve data utilized by the user of the client device 101 and may be a local processor memory, a data cache, a server cache, a RAID storage system, a cloud storage system, a solid-state drive (SSD), a hard disc drive (HDD), a hybrid storage device, an array of storage devices, a portable thumb (e.g., USB) drive, etc. The interface 103 can take substantially any form including but not limited to a local wired or wireless interface, a local area network (LAN), a wide area network (WAN), a cloud computing interface, the Internet, etc. Substantially any useful interface protocol can be implemented for the interface 103 including Ethernet, USB, SCSI, SAS, Fibre Channel, PCMI, wireless connections, etc.

Of interest is the data storage device 102, which is shown to include a controller 104 and a memory 106. The controller 104 can include one or more programmable processors that execute program instructions stored in a local memory to carry out various functions, including the control of data transfers between the memory 106 and the client 101 across the interface 103. Additionally or alternatively, the controller 104 can utilize a hardware circuitry such as formed of ASCI (application specific integrated circuits), FPGA (field programmable gate arrays), state machines, or other arrangements of gate logic.

The memory 106 can include any number of useful forms including local memory for the controller, cache memory, buffer, main storage, etc. The memory 106 includes non-volatile memory (NVM), which will be understood, consistent with the customary usage of this term, as persistent memory that continues to retain information stored therein even after the removal of applied power to the memory. The form of the main data store can take any number of forms, including semiconductor based memory, rotatable data storage memory, tape based memory, etc.

Figure 2:
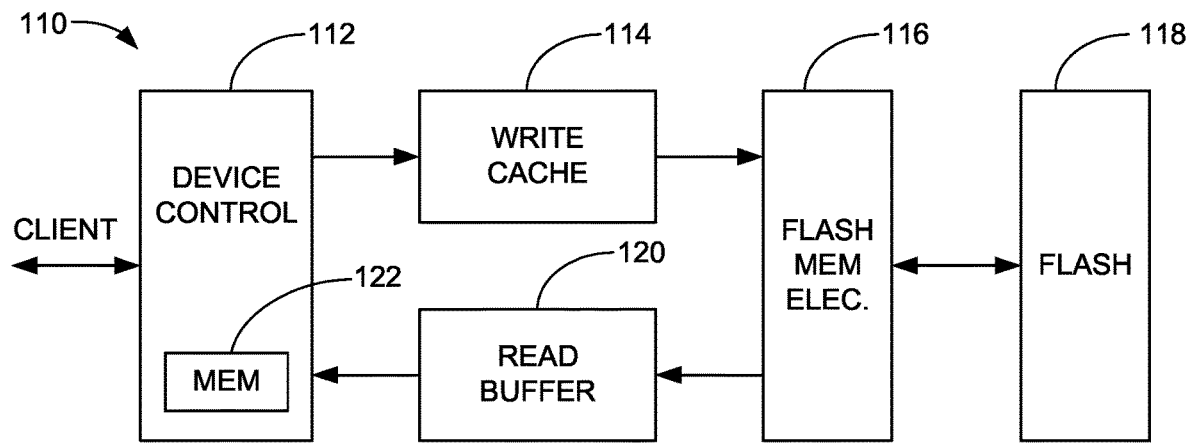
FIG. 2 is a functional block representation of the data storage device of FIG. 1 characterized as a solid-state drive (SSD) in some embodiments.

FIG. 2 depicts aspects of a data storage device 110 that corresponds to the data storage device 102 of FIG. 1 in some embodiments. In FIG. 2, the data storage device 110 is characterized as a solid-state drive (SSD) that utilizes flash memory as a main memory store. This is not limiting, as any number of other forms of data storage devices can be utilized, including but not limited to hard disc drives (HDDs), hybrid drives, tape drives, optical drives, magneto-optical (MO) drives, etc.

The SSD 110 includes a device controller 112 that corresponds to the controller 104 in FIG. 1. A write cache 114 is an internal buffer memory that temporarily stores sets of write data provided from the external host prior to transfer to the main store. These sets of write data may accompany a write command from the requesting client to store the data for future use.

A flash memory electronics circuit 116 operates as a front end to receive and process the sets of write data for transfer to a flash array 118. A read buffer 120 temporarily stores corresponding sets of read back data retrieved from the flash array 118, via the electronics circuit 116, in response to a read command. The read back data are subsequently transferred from the read buffer 120 to the requesting client that issued the read command. Internal controller memory (MEM) 122 may store program instructions, data queues, command queues, map data, and other forms of control data to facilitate these operations.

For purposes of the present disclosure, the multi-FME memories disclosed herein can be utilized in any number of ways, including but not limited to aspects of the write cache 114, the flash memory electronics 116, the main (flash) store 118, the read buffer 120 and/or the local processor memory 122. In some cases, the multi-FME memories can be used in lieu of the flash memory in the main store 118.

Figure 3:
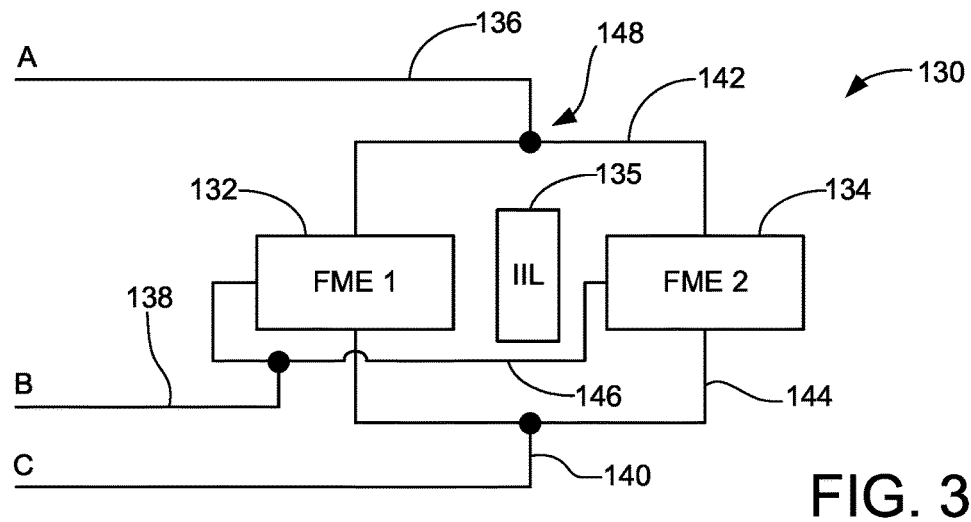
FIG. 3 shows a memory cell of the data storage devices of FIGS. 1-2 having multiple ferroelectric memory elements (FMEs) in accordance with various embodiments.

FIG. 3 shows a multi-FME memory cell 130 in accordance with some embodiments. The cell 130 includes a first ferroelectric memory element (FME 1) 132 and a second ferroelectric memory element (FME 2) 134. These respective elements 132, 134 are arranged in parallel, although such is not necessarily required. While two (2) elements are shown in FIG. 3, it will be understood that a multi-FME memory cell as disclosed herein can have any plural number of FMEs, including numbers greater than two (2).

The FMEs 132, 134 are in close proximity to reduce the overall size of the cell 130, but are otherwise physically and electrically isolated from one another such as through the use of an intervening insulating layer (ILL) 135. Similar isolating layers are contemplated for each of the alternative embodiments discussed herein but are omitted for simplicity of illustration.

Control lines 136, 138 and 140 are interconnected to the cell 130. These control lines are respectively denoted as connections A, B, and C, and may be characterized as bit lines, word lines and source lines, respectively. Other forms of control lines can be provisioned, such as voltage source lines, voltage ground lines, control select lines, bias lines, etc. The various control lines 136, 138 and 140 will be recognized as external control lines that interconnect the memory cell 130 to external circuitry, which will be discussed below. Stated another way, the external control lines connect to the multi-FME cell 130 as a unit.

Because the memory cell 130 incorporates multiple FMEs, there will be various internal control lines within the memory cell as well. These internal control lines include lines 142, 144 and 146. These internal lines may include various junctions, such as junction node 148. Generally, the internal control lines are not separately accessible externally to the multi-FME cell. Other internal lines can be incorporated, including internal lines that interconnect the FMEs but are not directly connected to the external lines.

Figure 4:
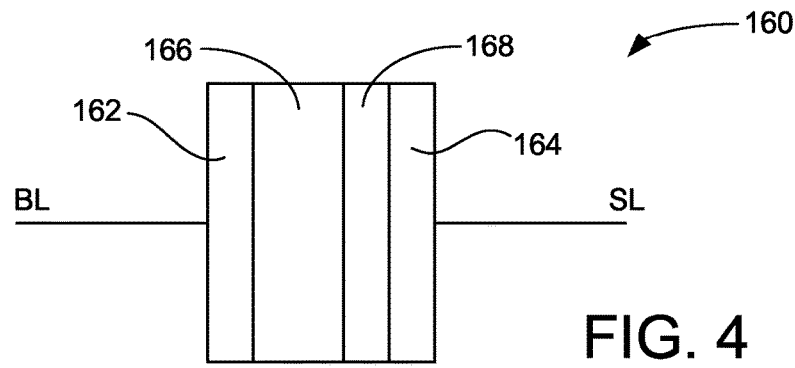
FIG. 4 is a functional block diagram of an FME configured as a ferroelectric tunnel junction (FTJ).

FIG. 4 shows a construction that can be used for one or both of the FMEs 132, 134 in FIG. 3 as a ferroelectric tunneling junction (FTJ) 160. The FTJ 160 is a two-terminal device with outer conductive electrode layers 162 164, an inner (programming) layer of ferroelectric material 166, and an optional tunnel barrier layer 168. The tunnel barrier layer 168 is contemplated but not necessarily required as a separate layer, and may be any suitable material such as but not limited to a non-ferroelectric material, a dielectric material, etc.

With the appropriate choice of electrode materials, tunnel barrier, and ferroelectric layer, the resistance of the FTJ can be made to depend on the orientation of the ferroelectric polarization of the ferroelectric layer 166. Stated another way, an FTJ such as the FTJ 160 operates in a manner similar to magnetic tunnel junctions (MTJs), and will present different electrical resistances between electrodes 162, 164 based on the programmed polarization of the ferroelectric layer 166. The differences in electrical resistance will vary depending on construction, but differential resistance values can be greater than $10^4$ ohms.

Control lines (not separately numerically designated) include a bit line (BL) coupled to electrode layer 162 and a source line (SL) coupled to electrode layer 164. The programmed state of the ferroelectric layer 166 can be sensed responsive to voltage drops and/or current limits obtained across the control lines (e.g., BL and SL).

Figure 5:
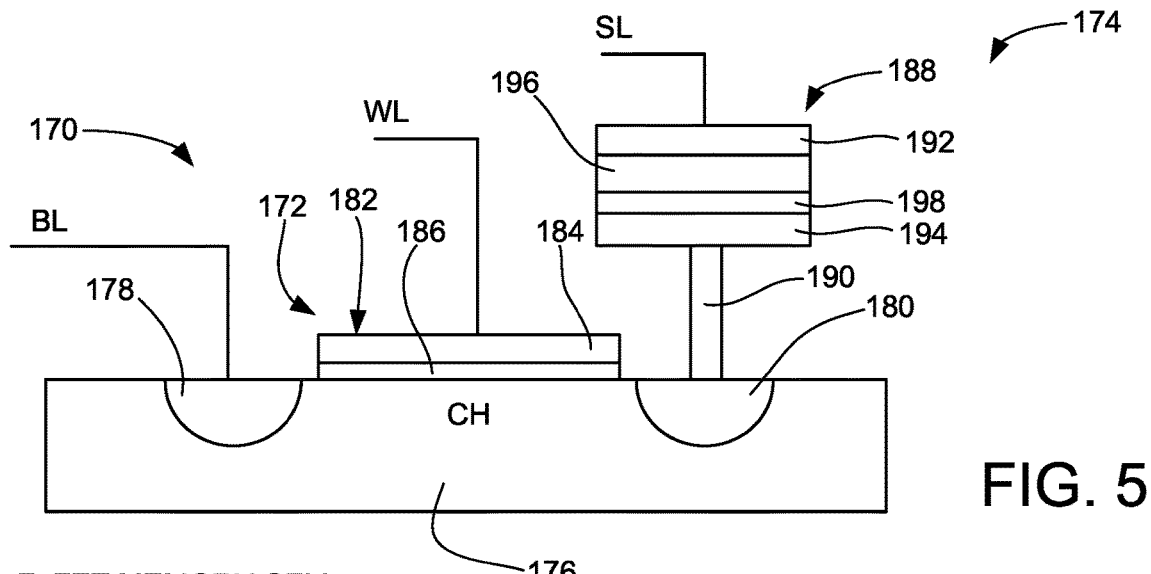
FIG. 5 is a functional block diagram of an FME configurated as a 1T1C FeRAM memory element having a transistor and a capacitor.

FIG. 5 shows another example construction for each of the FMEs 132, 134 in FIG. 3 as FeRAM cells 170. Each FeRAM cell 170 is characterized as a 1T1C arrangement, although other configurations can be used. The FeRAM cell 170 includes at least one transistor 172 and at least one capacitor 174. Each transistor 172 is formed using a base semiconductor substrate 176 with respective doped regions 178, 180 to form respective source and drain regions. While not limiting, the regions 178, 180 may be p doped and the substrate 176 may be n doped. A channel (CH) is formed between these respective regions, as shown. A gate structure 182 is disposed between the source and drain regions 178, 180 adjacent the channel region. The gate structure 182 includes a conductive gate 184 and an isolating region 186.

The capacitor 174 extends as a capacitive structure 188 from the drain region 180 via conductive path 190. The capacitor structure includes upper and lower electrode layers 192, 194. A ferroelectric layer 196 is disposed between the electrode layers 190, 192. As desired, a tunneling or interposed layer 198 can also be provided between the electrode layers. In this way, the control gate voltage applied to electrode conductive gate 184 can be used to determine the electric polarity of ferroelectric layer 196 in relation to the amount of voltage required to place the transistor into a forward conductive state from source to drain 178, 180. Internal bit lines include a bit line (BL) coupled to drain 170, a source line (SL) coupled to source 180, and a word line (WL) coupled to control gate 184.

Figure 6:
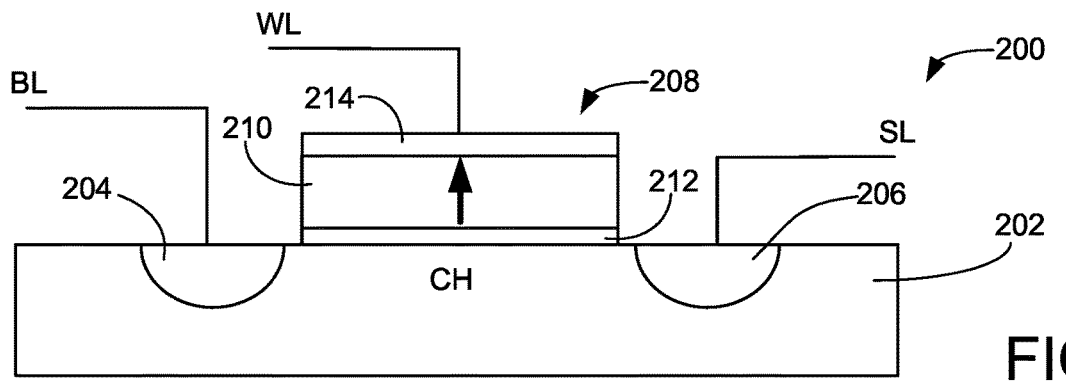
FIG. 6 is a functional block diagram of an FME configurated as an FeFET having a ferroelectric layer.

FIG. 6 shows yet another FME construction that can be used in FIG. 3 as an FeFET 200. The FeFET 200 includes a semiconductor substrate 202 in which doped regions 204, 206 are formed to provide respective source and drain regions. As before, regions 204, 206 may be p doped and substrate 202 may be n doped, but this is not necessarily required.

A gate structure 208 is provided between the source and drain regions 204, 206 to manage a channel (CH) therebetween. The gate structure 208 includes a ferroelectric layer 210 sandwiched between an isolating layer 212 and an electrically conductive gate layer 214. It will be noted that a number of different gate structures are known for FeFETs, including a single layer of ferroelectric material, the addition of an insulative layer (as shown), the addition of a metal layer, a laminated arrangement with multiple spaced apart ferroelectric layers, and so on. Internal control lines are shown via BL, SL and WL lines coupled to respective regions 204, 206 and 214.

While the FTJs 160 and FeRAM 170 may be read destructive and therefore may require a refresh operation after a read operation, the FeFETs 200 are often not read destructive (e.g., truly non-volatile) and therefore may not need the application of a subsequent refresh operation to retain the storage state after a read operation. Many other ferroelectric memory configurations are known in the art and can be arranged as desired, including XTYC configurations where X and Y are some selected integers of transistors and capacitors; hybrid configurations where ferroelectric layers are arranged in various gate structures or other elements, and so on.

Figure 7:
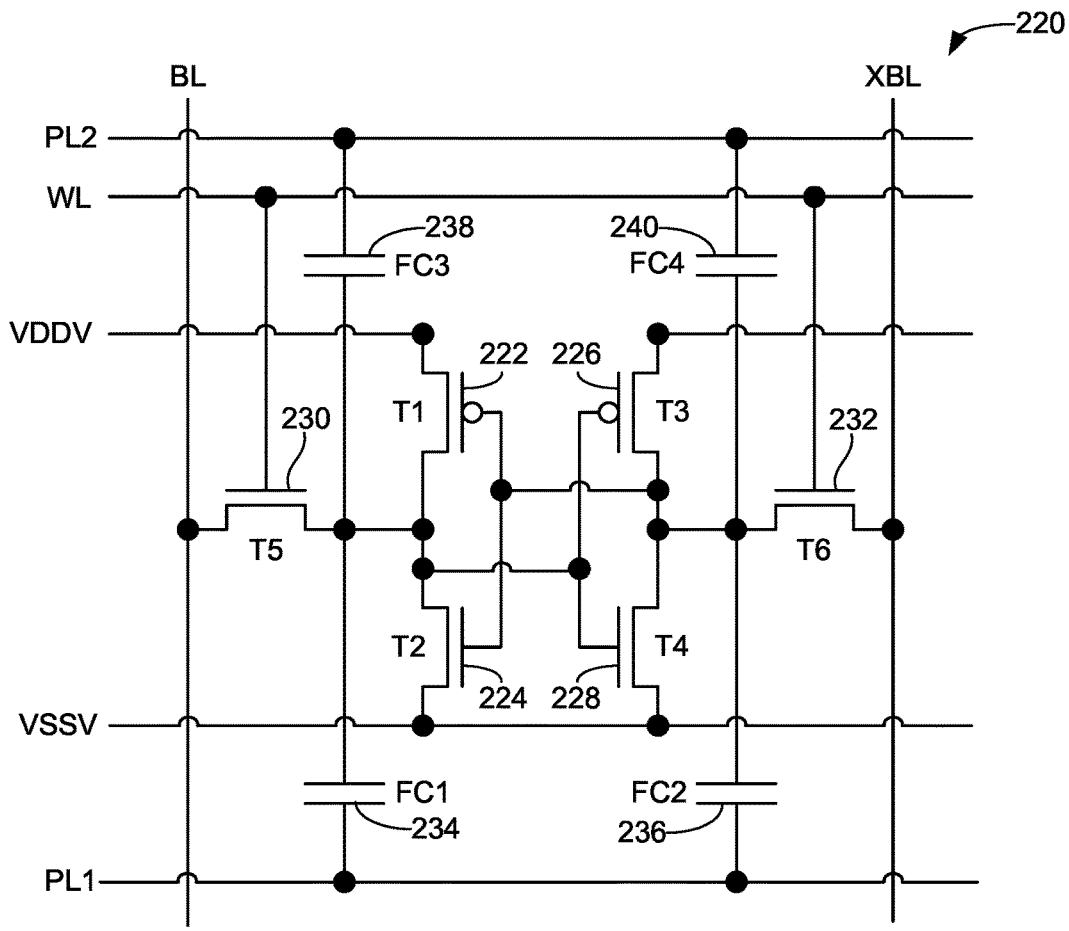
FIG. 7 is a functional block diagram of an FME configured as a 6T4C FeRAM memory element having six (6) transistors and four (4) capacitors.

FIG. 7 shows a configuration for a selected FME 132, 134 from FIG. 3 as a 6T4C FeRAM cell 220. As the name implies, the cell 220 includes a total of six (6) transistors and four (4) ferroelectric capacitors. The transistors are denoted as T1-T6 and are numerically identified as transistors 222, 224, 226, 228, 230 and 232. Transistors T1 and T3 may be p-type transistors and transistors T2, T4-T6 may be n-type transistors. The transistors may be MOSFETs (metal oxide semiconductor field effect transistors) each having respective gate, drain and source regions interconnected as shown.

The ferroelectric capacitors are denoted as FC1 through FC4 and numerically identified as 234, 236, 238 and 240. Each capacitor may have a construction similar to that described above in FIG. 5, so that each capacitor may include a pair of opposing electrode plates and an intervening ferroelectric layer (or multiple such layers). One or more tunneling or interposing layers may also be incorporated into each capacitor stack.

Data bits may be stored in relation to the impressed electrical polarity of the respective capacitors based on various input lines (these are denoted as various internal control lines including BL, XBL, PL1, PL2, WL, VSSV and VDDV). The 6T4C cell 220 can store a single bit, a partial bit or multiple bits as desired. It will be appreciated by those skilled in the art that the 6T4C arrangement of FIG. 7 can be characterized as having a non-volatile SRAM type configuration.

Figures 8, 9:
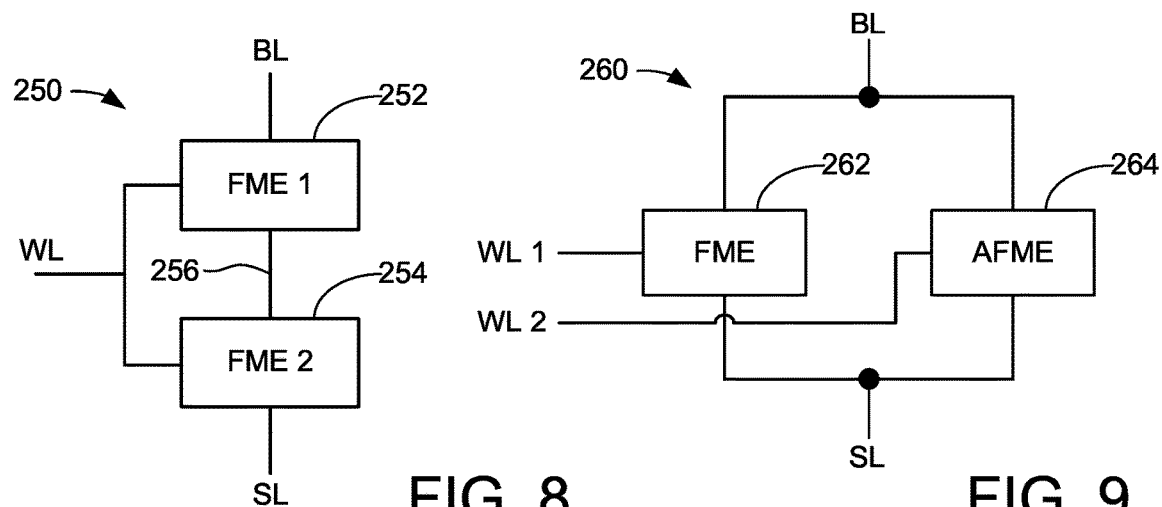
FIG. 8 is a functional block diagram with two FMEs arranged in series.
FIG. 9 is a functional block diagram with an FME and an anti-ferromagnetic memory element (AFME).

FIG. 8 shows another multi-FME cell 250 in accordance with some embodiments. In this case, two FMEs are provided (FME1 and FME2) 252, 254 which are coupled in series. Respective BL and SL connections are shown, as well as optional WL lines if needed. An internal connection line between the respective elements FME1 and FME2 is denoted at 256.

FIG. 9 shows yet another multi-FME cell 260 which includes an FME 262 and an anti-ferroelectric memory element (AFME) 264. As will be recognized, AFMEs such as 264 operate as anti-ferroelectric regions having programmed states that can be detectable through the application of voltages or currents. Hence, it will be understood for the purposes of the present discussion that FMEs can include AFMEs. The respective elements are accessed by common BL and SL connections, and individual WL connections (denoted as WL1 and WL2).

An alternative embodiment to that shown in FIG. 9 uses the same interconnection line arrangement, but both elements 262, 264 have ferroelectric layers (or both have anti-ferroelectric layers). It will be appreciated that the respective word lines (WL or B) in FIGS. 3, 8 and 9 are suitable for FeRAM and FeFET type FMEs, but may not be required for FTJ type FMEs.

Figure 10:
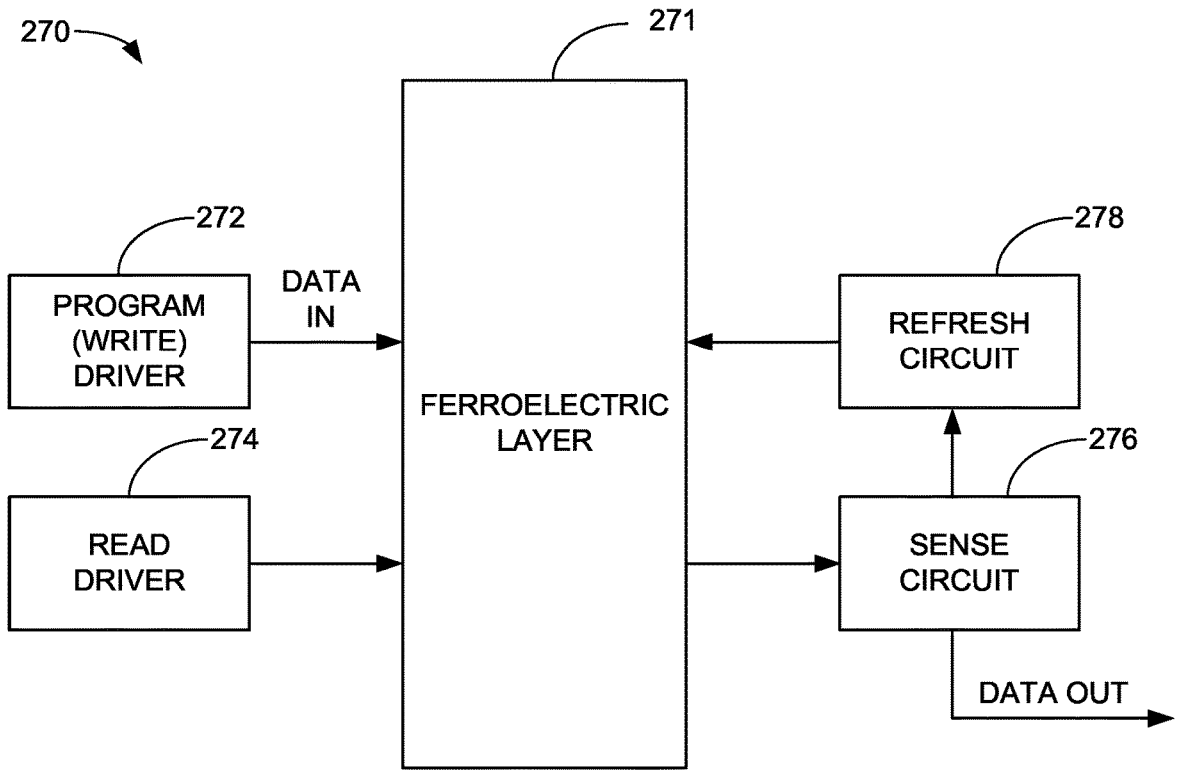
FIG. 10 shows control circuitry used to adaptively program data to and read data from a ferroelectric layer.

FIG. 10 shows a control circuit 270 that can be used to control various FME cells in accordance with various embodiments. The circuitry 270 is shown to be operative upon a ferroelectric layer 271. In the practice of the various embodiments presented herein, it will be understood that these circuitry functions will be applied to any number of such layers 271 as arranged in the various FMEs of the multi-FME cell.

It follows that the control circuit includes a program (write) driver 272, a read driver 274, a sense circuit 276 and a refresh circuit 278. These various circuits operate to set, sense and, as necessary, retain the programmed electrical polarity of the associated ferroelectric layer 271.

The program driver 272 is utilized to write (program) data to the respective memory cells of the stack on a cache line basis. This can include the presentation of appropriate voltages and/or currents on the control lines to place the associated ferroelectric layers in the desired programmed orientations.

The read driver 274 places appropriate voltages and/or currents on the respective control lines to enable the sense circuit 276 to sense the programmed orientations of the respective ferroelectric layers.

The refresh circuit 278 operates to refresh the current programmed states of the ferroelectric layers 271 at appropriate times. In some cases, the refresh circuit 278 operates at the conclusion of each read operation, in those configurations where a read operation destroys the currently stored state. In this situation, once data are read from a selected location in the ferroelectric layers, the refresh circuit buffers and rewrites the previously stored data back to that selected location from which the data retrieved (as is commonly performed with DRAM). That is, as data bits are stored within the stack, data bits may need to be rewritten (or not) as the data are read.

The various program, read, sense and refresh circuits 272, 274, 276 and 278 will be coupled to the external control lines of the multi-FME cell, and will be configured to write, read, sense and refresh the stored data accordingly. This will be true irrespective of the actual configuration of the multi-FME cell.

Figure 11:
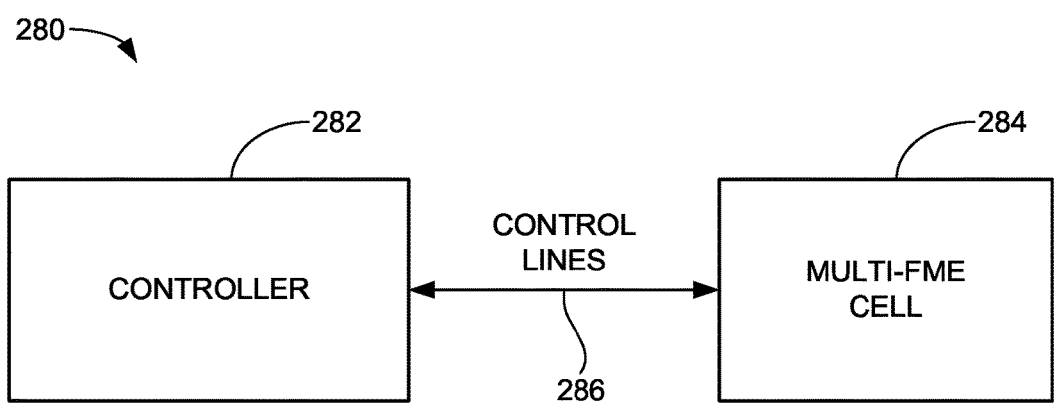
FIG. 11 shows a controller configured to interact with a multi-FME cell via various control lines.

FIG. 11 shows a functional block diagram for a data transfer circuit 280 in accordance with some embodiments. The circuit 280 can be incorporated into the data systems described above using the various memory cell configurations described above. At a high level, it will be understood that a controller 282, which can include hardware and/or programmable processor circuitry, will direct and receive control signals with a multi-FME cell 284 via various external control lines 286. It will be further understood that the cell 284 can be configured to incorporate any number of combinations of the foregoing FME types and multi-cell constructions, as well as those discussed below.

Figure 12:
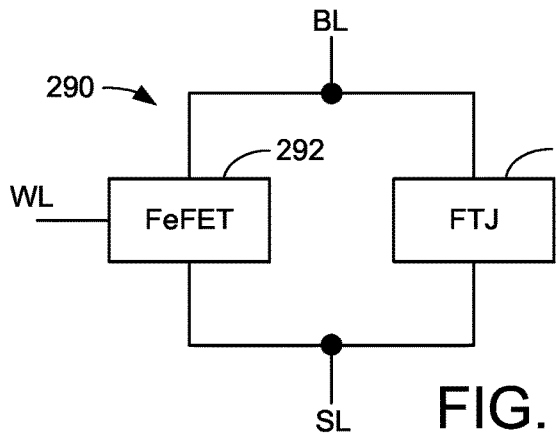
FIG. 12 shows an exemplary multi-FME cell having an FeFET and an FTJ.

FIG. 12 is a functional block representation of a multi-FME cell 290 that includes a FeFET 292 in parallel with an FTJ. In this arrangement, a bit line (BL) can be provisioned to be coupled to both of the FME elements 292, 294. A word line (WL) can be supplied to control the gate functions of the FeFET (no such gate function is required for the FTJ). Output signals are supplied to a common source line (SL) coupled to each of the elements 292, 294.

In this arrangement, data bits can be programmed in relation to the ferroelectric layer of the gate structure of the FeFET (see FIG. 6) as well as to the ferroelectric layer of the FTJ (see FIG. 4). Depending on the construction of these respective elements, multiple bits can be stored in relation to the applied voltage/current density at the BL input; some values may be sufficient to place the transistor of the FeFET into a forward conductive mode; other values may be sufficient to maintain the transistor in a non-conductive mode but to permit current to flow through the FTJ; and so on. This unique combination of an FTJ and an FeFET can provide a number of memory storage solutions.

Figure 13:
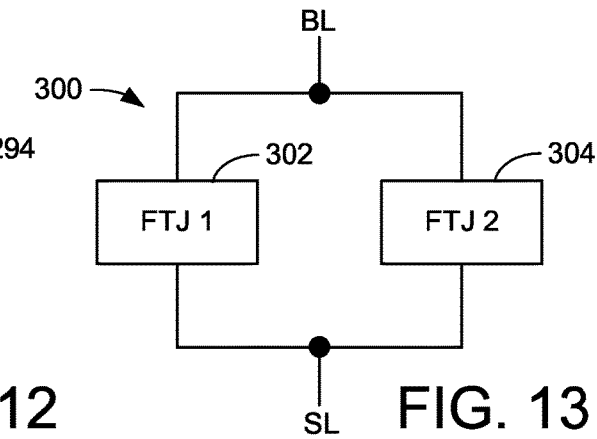
FIG. 13 shows an exemplary multi-FME cell with two respective FTJs connected in parallel.

FIG. 13 shows another arrangement for a multi-FME memory cell 300 that incorporates two separate FTJs 302, 304, denoted as FTJ 1 and FTJ 2. In some cases, these elements can be nominally identical but with different constructions based on reversed ordering; that is, FTJ 1 can have a ferroelectric layer adjacent the top electrode and FTJ 2 can have the ferroelectric layer adjacent the bottom electrode. In this arrangement, the same data bit can be stored in each of the respective elements, but the faster reading response can be supplied irrespective of the programmed state.

In other arrangements, the respective elements 302, 304 can have the same orientation but different constructions such as different thicknesses or areal extents of the respective ferroelectric, tunneling, or interposing layers, etc. In this way, different data bits can be stored and retrieved using different input values supplied to the external control lines.

Figure 14:
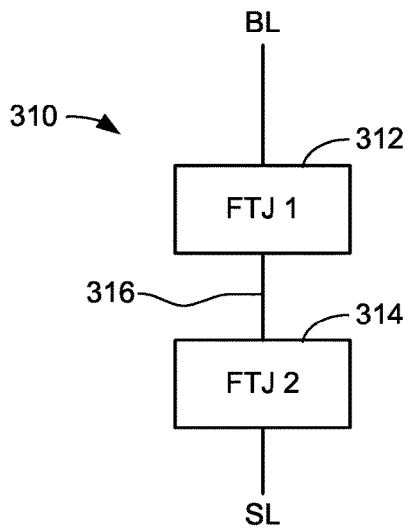
FIG. 14 shows an exemplary multi-FME cell with two respective FTJs connected in series.

FIG. 14 shows yet another alternative exemplary configuration for a multi-FME memory cell 310. In this case, two FTJs are once again provided, but in this case the FTJs are arranged in series, so that a first FTJ (FTJ 1) 312 is upstream of a second FTJ (FTJ 2) 314 between respective BL and SL. In this case, the same or different constructions can be supplied to the various layers of the respective elements to store one or more data bits. It will be noted that 316 identifies an internal connection line not normally accessible by the controller or other external control circuitry.

Figure 15:
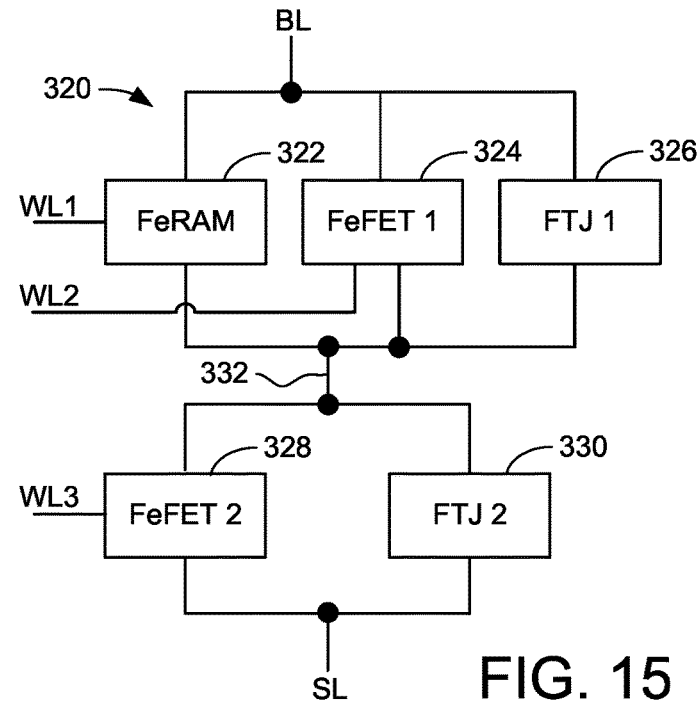
FIG. 15 shows an exemplary multi-FME cell with various groups of FMEs connected in both parallel and in series.

FIG. 15 provides a complex multi-FME memory cell 320 in further embodiments. This arrangement includes a first row of memory elements including an FeRAM 322, a first FeFET (FeFET 1) 324 and a first FTJ (FTJ 1) 326. These are arranged in parallel from an input BL. Below this is a second row of elements including a second FeFET (FeFET 2) 328 and a second FTJ (FTJ 2) 330) which are coupled in series with an output SL. The first and second rows of elements are shown to be connected in series. An internal connection is shown at 322.

In this case, various external control lines are provided including the aforementioned BL and SL, as well as three (3) word lines (WLs) denoted as WL1, WL2 and WL3. In this way, the single memory cell 320 can be arranged to store several bits which can be both programmed and sensed based on the application of different combinations of values to the external control lines.

Figure 16:
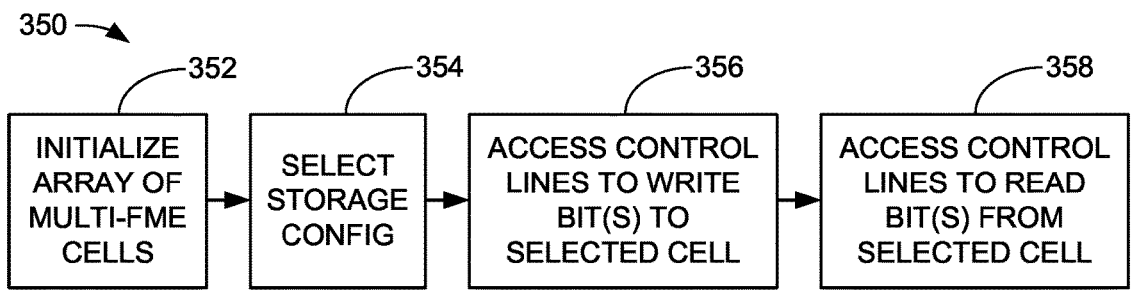
FIG. 16 provides a flow sequence for data transfer operations that can be carried out in accordance with various embodiments.

FIG. 16 provides a flow sequence 350 to illustrate a data transfer operation carried out in accordance with the foregoing discussion. It will be appreciated that the flow sequence 350 is merely exemplary so that other operations can be carried out depending on the requirements of a given application.

An array of multi-FME cells is first initialized at block 352. The array can take any number of forms including as part of a memory utilized by a storage device such as the SSD 110 in FIG. 2. For purposes of providing a concrete illustration, it will be contemplated that each cell has a configuration as set forth in FIG. 3, with each of the FMEs 132, 134 being of the same type (e.g., both are FeFETs) but one of the FeFETs is larger in at least one aspect as compared to the other (for example, a thicker ferroelectric layer, etc.). This is merely for purposes of illustration and is not limiting.

At block 354, a selected storage configuration for each of a group of multi-FME cells is selected. This may be carried out responsive to receipt of a data write command from an external client device as in FIG. 1, with the group of cells identified as a target location for the storage of the write data. Different storage configurations include storing multiple bits to each cell (one bit per FME), storing one bit to each cell by storing the same bit in each FME, storing one or more bits based on different storage states of the cells (e.g., eight bits using three FMEs using polarities of 000 to 111), and so on. While not limiting, the cells can be configured such that appropriate control signals can individually set the program state of each FME, either concurrently or in a selected order.

A program operation thereafter takes place at block 356 to write the selected data to each selected multi-FME cell by accessing the appropriate control lines. The data are subsequently read from the cell during a subsequent read operation (such as responsive to a subsequent read command from the client) by again accessing the appropriate control lines.

By applying the program and read control inputs to the external control lines in a selected order, the controller circuit can advantageously program and read the states of the individual FMEs in each cell. For example, as noted above providing a lower first voltage may operate to program or sense one of the FMEs without affecting the program or sense state of the other FME, after which a higher second voltage can be applied to program or sense the remaining one of the FMEs.

In another case, the selected order can involve a first set of applied control inputs to program the stronger of the FMEs to a selected state (e.g., an FME having a construction that requires a higher level of power, etc.). The first set of applied control inputs also programs the weaker of the FMEs to the selected state. However, since the weaker of the FMEs requires a lower level of power, the selected order can further involve application of a second set of applied inputs sufficient to change the program state of the weaker FME without affecting the previously programmed stronger FME. Similar sequencing can be carried out during read operations.

Even for cells with nominally identical FME constructions, providing the control signals in a selected order during read/write operations can be used to program and read the contents based on different read/write responses and characteristics of the cell.

In another use case, each of the first and second FMEs in the cell are nominally identical and the first FME is inverted with respect to the second FME within the memory cell. Each of the first and second FMEs are programmed with the same bit value to enhance readback latency of a reading operation to retrieve the same bit value during a read operation, since one FME will tend to provide a faster response than the other depending on the polarity.

It is contemplated that these various arrangements can provide a number of benefits including enhanced read and write speeds, data reliability, data endurance, switching efficiencies, etc. Control circuitry can be used to enhance power, endurance and latency characteristics of the memory.

It will now be appreciated that various embodiments can provide a number of benefits over the existing art. Operations can be advantageous in which a partial bit, a single bit, or multiple bits are stored in a ferroelectric memory cell that incorporates multiple FMEs. Factors such as power, endurance and latency can be enhanced based on the construction and operation of such cells. Other forms of memory cell elements can be incorporated, including volatile cells (e.g., DRAM, SRAM, etc.), non-volatile cells (e.g., flash, NVRAM, etc.).

It is to be understood that even though numerous characteristics and advantages of various embodiments of the present disclosure have been set forth in the foregoing description, together with details of the structure and function of various embodiments of the disclosure, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. An apparatus comprising:
   a non-volatile memory (NVM) comprising an array of semiconductor memory cells, each memory cell comprising first and second ferroelectric memory elements (FMEs), each of the first and second FMEs having at least one ferroelectric to store at least one bit in the memory cell; and
   a control circuit configured to activate a common set of external control lines, coupled to a selected memory cell, in a selected order to read the at least one bit from the selected memory cell, wherein the selected order comprising applying a first set of control inputs to program the first FME and subsequently applying a second set of control inputs to program the second FME, the second FME requiring power level lower than the power level required by the first FME.

2. The apparatus of claim 1, wherein the first and second FMEs have a nominally identical construction.

3. The apparatus of claim 1, wherein each of the first and second FMEs has a different construction.

4. The apparatus of claim 1, wherein the control circuit is further configured to activate the first FME in the selected memory cell while retaining the remaining second FME in the selected memory cell in an inactive state in order to retrieve the at least one bit from the selected memory cell.

5. The apparatus of claim 1, wherein the control circuit is further configured to activate the common set of external control lines coupled to the selected memory cell in a second selected order to program the at least one bit to the selected memory cell.

6. The apparatus of claim 1, wherein the first and second FMEs are arranged in parallel within the selected memory cell.

7. The apparatus of claim 1, wherein the first and second FMEs are arranged in series within the selected memory cell.

8. The apparatus of claim 1, wherein at least a selected one of the first or second FMEs is characterized as a ferroelectric tunneling junction (FTJ), a ferroelectric random access memory (FeRAM) memory cell having at least one transistor and at least one capacitor, or a ferroelectric field effect transistor (FeFET).

9. The apparatus of claim 1, wherein each of the first and second FMEs are nominally identical and the first FME is physically inverted with respect to the second FME within the selected memory cell.

10. The apparatus of claim 1, wherein the NVM is a stack register which forms a portion of a data storage device having a main memory store to store user data from a client device.

11. The apparatus of claim 1, wherein the NVM is a main data store of a solid-state drive (SSD).

12. The apparatus of claim 1, wherein the selected memory cell further comprises a volatile memory element.

13. The apparatus of claim 1, wherein the NVM is characterized as a selected one of a write cache, a read buffer, or a local processor memory of a solid-state drive (SSD).

14. A data storage device, comprising:
a non-volatile memory cell comprising first and second ferroelectric memory elements (FMEs) interconnected with a common set of external control lines and each having a different program/read response, wherein the second FME requiring power level lower than the power level required by the first FME; and
a controller circuit configured to program data to and read data from the FMEs by directing control signals to the external control lines in respective orders, wherein the respective order comprising applying a first set of control inputs to program the first FME and subsequently applying a second set of control inputs to program the second FME.

15. The data storage device of claim 14, wherein the controller is configured to program first data to the respective first and second FMEs by applying a first set of control signals to the external control lines in a first order, and wherein the controller is configured to program second data to the respective first and second FMEs by applying a second set of control signals to the external control lines in a different, second order.

16. The data storage device of claim 14, wherein the controller is configured to read first data from the respective first and second FMEs by applying a first set of control signals to the external control lines in a first order, and wherein the controller is configured to read second data to the respective first and second FMEs by applying a second set of control signals to the external control lines in a different, second order.

17. The data storage device of claim 14, wherein the first and second FMEs share a common, nominally identical construction.

18. The data storage device of claim 14, wherein the first and second FMEs have different respective constructions.

19. The data storage device of claim 14, where each of the first and second FMEs have a selected one of a ferroelectric tunneling junction (FTJ) construction, a ferroelectric random access memory (FeRAM) construction, or a ferroelectric field effect transistor (FeFET) construction.

20. The data storage device of claim 14, wherein the first FME has a ferroelectric layer formed of ferroelectric material and the second FME has an anti-ferroelectric layer formed of anti-ferroelectric material.

* * * * *